United States Patent
Tokita (10) Patent No.: US 8,747,778 B2
(45) Date of Patent: Jun. 10, 2014

(54) METHOD OF PRODUCING MICROFLUIDIC DEVICE

(75) Inventor: Toshinobu Tokita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 911 days.

(21) Appl. No.: 12/677,042

(22) PCT Filed: Sep. 10, 2008

(86) PCT No.: PCT/JP2008/066798
§ 371 (c)(1),
(2), (4) Date: Mar. 8, 2010

(87) PCT Pub. No.: WO2009/035126
PCT Pub. Date: Mar. 19, 2009

(65) Prior Publication Data
US 2011/0014086 A1   Jan. 20, 2011

(30) Foreign Application Priority Data

Sep. 14, 2007 (JP) .................................. 2007-239244

(51) Int. Cl.
*B01L 99/00* (2010.01)
*B29C 35/08* (2006.01)

(52) U.S. Cl.
USPC ......................................... 422/503; 264/425

(58) Field of Classification Search
USPC ................................... 422/502, 503; 264/425
See application file for complete search history.

(56) References Cited

U.S. PATENT DOCUMENTS

| 5,858,188 A | 1/1999 | Soane et al. |
| 6,238,538 B1 | 5/2001 | Taniguchi et al. |
| 2002/0029814 A1* | 3/2002 | Unger et al. ................ 137/824 |
| 2002/0100714 A1* | 8/2002 | Staats .......................... 210/85 |
| 2002/0110932 A1* | 8/2002 | Wagner et al. ............... 436/518 |
| 2004/0219711 A1* | 11/2004 | Wu et al. ...................... 438/106 |
| 2006/0051026 A1* | 3/2006 | Nikolajeff et al. ............ 385/49 |
| 2006/0091051 A1* | 5/2006 | Takada et al. ............ 210/198.2 |

FOREIGN PATENT DOCUMENTS

| JP | 2004-049223 A | 2/2004 |
| JP | 2006-010327 A | 1/2006 |

* cited by examiner

*Primary Examiner* — Paul Hyun
(74) *Attorney, Agent, or Firm* — Fitzpatrick, Cella, Harper & Scinto (57) ABSTRACT

There is provided a method of producing a microfluidic device including a substrate having a depressed portion and a cover member, whereby to reduce the dispersion of a geometric individual difference and the possibility that a non-joint area can occur in a joint portion between the substrate and the cover member. At the time of producing the microfluidic device, the depressed portion serving as a channel, a chamber and a reservoir is formed in advance in the substrate and a liquid-state energy ray curable resin is applied to the surface of the substrate in which the depressed portion is formed. The energy ray curable resin is cured by an energy ray irradiation unit and caused to serve as the cover on the depressed portion of the substrate, thereby to form the channel, chamber and reservoir.

6 Claims, 7 Drawing Sheets

METHOD OF PRODUCING MICROFLUIDIC DEVICE

The present application is a national stage application based on PCT/JP2008/066798, filed Sep. 10, 2008.

TECHNICAL FIELD

The present invention relates to a microfluidic device and an apparatus using the same.

BACKGROUND ART

Micro electro mechanical systems (MEMS) are applied to bionics, environmental analysis and chemical synthesis that draw attention as one of application fields of the MEMS. As such a device, there are known a microfluidic device or micro total analysis systems (μTAS). These devices are such that a channel, a chamber and a reservoir are formed on a substrate of semiconductor, glass, ceramic or plastic, and a sample, reagent or liquid being material for chemical synthesis as a specimen is caused to flow thereinto to perform analysis or chemical synthesis.

These devices have a microscale advantage of reducing the consumption of a solvent, sample and reagent as compared with a conventional analyzing method or batch process and being faster in reaction rate, so that if a practical device can be mass-produced, a simple inspection method can be provided for a medical and an environmental field. For this reason, there is expected the development of a method of producing a microfluidic device whereby to enable stably producing a device with less individual difference.

As a conventional method of producing a microfluidic device, there has existed a method of forming a channel or a chamber by joining a cover layer 300 to a substrate layer in which a groove as a channel and a hole as a chamber are formed (refer to U.S. Pat. Nos. 6,238,538 and 5,858,188). U.S. Pat. No. 6,238,538 describes a method of overlaying a substrate layer finely processed by embossing with a cover layer to join together. The joining is performed by adhesion, deposition, pressure jointing or thermal jointing.

DISCLOSURE OF THE INVENTION

Figure 9:
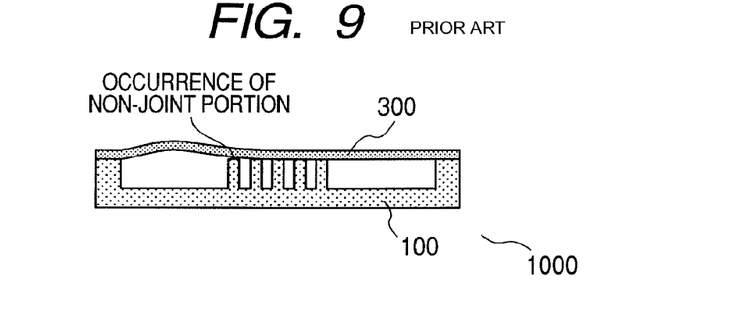
FIG. 9 is a schematic diagram describing problems of the microfluidic device in a conventional producing method.

A conventional art, however, has the following problems as described referring to FIG. 9. When a cover layer 300 is joined to a substrate layer 100, a joint surface requires a highly accurate flatness. For example, when a fine structure like a nano-pillar is formed, a non-joint portion can occur as illustrated in FIG. 9.

There exists a method in which at least any one of the substrate layer 100 and the cover layer 300 is formed of comparatively flexible material to improve adhesion thereof, suppressing the occurrence of the non-joint portion. The material used in the method is comparatively flexible, however, the method uses the deformation of the material, so that the retaining strength of deformation is prone to deform a microfluidic device 1000 itself. Since the deformation causes an error in dimension in the fine structure to cause an individual difference in the microfluidic device 1000 produced by the method, which may lower controllability. That leads to decrease in the productivity (yield) of the microfluidic device 1000.

The present invention has been made in view of such problems and has its object to solve the problems. Furthermore, the object of the present invention is to provide a covering method whereby to suppress the occurrence of a non-joint portion in a joint position between a substrate and a lid at the time of producing the microfluidic device including a substrate in which a depressed portion is formed and a lid for covering the upper face of the depressed portion of the substrate. Another object of the present invention is to provide a method of producing the microfluidic device whereby to suppress the dispersion of a geometric individual difference of the microfluidic device to improve controllability and productivity (yield). Still another object of the present invention is to provide the microfluidic device superior in controllability by not causing the non-joint portion to occur in the joint position between the substrate having the depressed portion and the lid and reducing the dispersion of the individual difference.

To achieve the above objects, according to a first aspect of the present invention, a method of producing a microfluidic device including a substrate in which a depressed portion is formed and a cover member for covering the upper face of the depressed portion is characterized by including the steps of: adhering an energy ray curable resin still to be cured to the surface of the substrate in which the depressed portion is formed so as to cover the upper face of the depressed portion of the substrate; and irradiating with an energy ray the adhered energy ray curable resin still to be cured.

According to a second aspect of the present invention, a microfluidic device is characterized by including: a substrate including a depressed portion; and a cover member formed of a cured energy ray curable resin, on the surface of the substrate in which the depressed portion is formed.

Since the resin adhered to the upper face of the depressed portion (fine structure) in the substrate is in a liquid state, it is enable to produce the microfluidic device suppressing the non-joint portion from occurring on the upper face of the depressed portion (fine structure). No larger external force is not required for the production thereof, enabling suppressing the deformation of structure of the microfluidic device. This reduces the individual difference of each microfluidic device to improve controllability. As a result, the yield of the microfluidic device can be increased.

Further features of the present invention will become apparent from the following description of exemplary embodiments with reference to the attached drawings.

BEST MODES FOR CARRYING OUT THE INVENTION

A microfluidic device equipped with a channel and a chamber with a micro-scale fine structure can be formed such that a depressed portion such as a groove and a hole is formed in a substrate material and the upper face of the depressed portion is covered with a cover member. For the channel, the depressed portion of the substrate is desirably 1 μm to 1000 μm in width, more desirably 10 μm to 500 μm in width.

A plurality of the channels may exist on the same substrate, intersect each other or be arranged together in parallel.

An energy ray curable resin is cured by irradiation with energy rays such as an electron beam, ion, charged particle, neutron, X-ray and ultraviolet ray. A generally known energy ray curable resin may be used without particular limitation. The generally known energy ray curable resin includes, for example, styrene polymer, polysulfone polymer, (meth) acryl polymer, polymaleimide polymer, polycarbonate polymer, polyolefin polymer, cellulose polymer, polyurethane polymer, polyamide polymer, polyimide polymer, polyether polymer, polythioether polymer, polyetherketone polymer, polyester polymer, epoxy resin, urea resin, phenol resin, fluorine polymer and silicon polymer.

As a liquid-state energy ray curable resin still to be cured, there may be suitably used a resin with a surface tension of a dozen $mJ/m^2$ to about 30 $mJ/m^2$.

An ultraviolet (UV) curable resin in energy ray curable composition resins may be suitably used to the present invention in light of the advantages of the ultraviolet curable resin that an irradiation time required for cure is short and limitations on environment under which an ultraviolet ray is used are comparatively less. An ultraviolet optical system used for irradiating the ultraviolet curable resin still to be cured with ultraviolet rays includes an ultraviolet light source such as an ultraviolet lamp or a semiconductor laser, an ultraviolet lens arranged on an optical path from the optical source to a resin material and a reflective mirror or an optical fiber. The ultraviolet optical system may be independently designed in conformity with the structure of a production apparatus or may incorporate a ready-made irradiation apparatus for an ultraviolet cure.

Out of the energy ray curable resins, a material cured not only by energy rays, but also by heat is preferable because the material can be quickly cured by heat applied by a heat generating unit such as a heater as well as by energy rays. The energy ray curable resin may include not only materials cured by energy rays but also other materials and additives. For example, an energy ray curable resin containing composition in which the energy ray curable resin material cured by energy rays are mixed with thermoset resin cured by heat is also included in the energy ray curable resins. As the energy ray curable resin, there may be suitably used a material having an ultraviolet curable resin and/or a thermoset resin, for example. In that case, an ultraviolet light source and an ultraviolet optical system and/or a heat generating source are used as an energy ray irradiation unit.

A material capable of adhering to the energy ray curable resin being the material for covering (cover member) the upper face of the depressed portion may be used as a substrate material without particular limitation. For example, resin, glass, quartz, ceramic, silicon, metal or the like may be used as the substrate material.

(A Method of Producing the Microfluidic Device)

A method of producing the microfluidic device has the following two steps (1) and (2):

Step (1); for adhering the energy ray curable resin still to be cured to the surface of the substrate in which the depressed portion is formed so as to cover the upper face of the depressed portion in the substrate and Step (2); for irradiating with energy rays the energy ray curable resin still to be cured and adhered to the depressed portion in the substrate.

The above adhesion step (1) may use the following methods 1) to 3):

Method 1); of adhering the energy ray curable resin still to be cured to a supporting body and then adhering them to the substrate, Method 2); of forming multiplayer flows (two-layer flows) including the energy ray curable resin still to be cured, inside the depressed portion of the substrate and then adhering the energy ray curable resin to the substrate, and Method 3); of adhering the energy ray curable resin still to be cured directly to the surface of the substrate in which the depressed portion is formed by using a dispenser.

The above method 1) includes the steps of: (i) adhering the energy ray curable resin still to be cured to a supporting unit for temporarily supporting the energy ray curable resin until the resin is cured; and (ii) causing the surface of the supporting unit to which the energy ray curable resin is adhered to oppose the surface of the substrate in which the depressed portion is formed. The method is preferably used if it is difficult for the energy ray curable resin still to be cured to independently maintain the shape of the cover member when the energy ray curable resin still to be cured is adhered to the substrate. A substrate having a flat surface (hereinafter, referred to as a "second substrate," discriminated from the substrate of the device) may be used as the supporting unit. At the opposition step (ii), the supporting unit may be caused to oppose the substrate on the device side so as to bring the supporting unit into close contact with the substrate or provide space between them.

The adhesion step preferably includes the step of forming the pattern shape of the energy ray curable resin on the supporting unit according to the pattern shape of the depressed portion of the substrate.

The above method 2) includes the steps of: (i) closing the upper face of the depressed portion of the substrate by a closing unit; (ii) causing the energy ray curable resin still to be cured and a non energy ray curable liquid to flow into the depressed portion of the substrate to form a layer and an interface; and (iii) stopping the flow after the layer and the interface have been formed by the flow of the energy ray curable resin still to be cured and the non energy ray curable liquid. In the liquid flowing into a micro-scale channel like the microfluidic device, interfacial tension energy is greater than gravity energy created by a difference in specific gravity between liquids. Therefore, when two or more different liquids enter a channel at the same time, the liquids are not mixed together and maintain a position and an order at the time of merger to form a liquid/liquid interface between them, and each liquid forms a layer and flows. The energy ray curable resin still to cured is caused to flow to the upper face of the depressed portion along with a liquid that is not cured by the irradiation of energy rays by taking advantage of such a characteristic of the microfluidic device. As the closing unit, there may be used a substrate with a flat surface (hereinafter, referred to as a second substrate, discriminated from the substrate of the device).

The present invention includes the microfluidic device produced at the above production process. The microfluidic device obtained by the above production method includes the substrate with the depressed portion and the cover member formed of the cured energy ray curable resin on the surface of the substrate in which the depressed portion is formed. The microfluidic device including a portion in which at least a part of the cover member enters the depressed portion in the substrate is preferable in respect that the depth of the portion contributes to the increase in strength of the channel. The microfluidic device produced using the Method 2) of forming multiplayer flows to adhere the energy ray curable resin to the substrate, as an adhesion step, is preferable because the microfluidic device can be configured so that most of portions of the cover member exist inside the depressed portion of the substrate and all portions of the cover member exist inside the depressed portion of the substrate.

A system using the microfluidic device according to the present invention is described below with reference to a first to a fifth embodiments.

EMBODIMENTS

First Embodiment

A first embodiment of the present invention is described with reference to FIG. 1 to FIGS. 4A and 4B.

Figure 1:
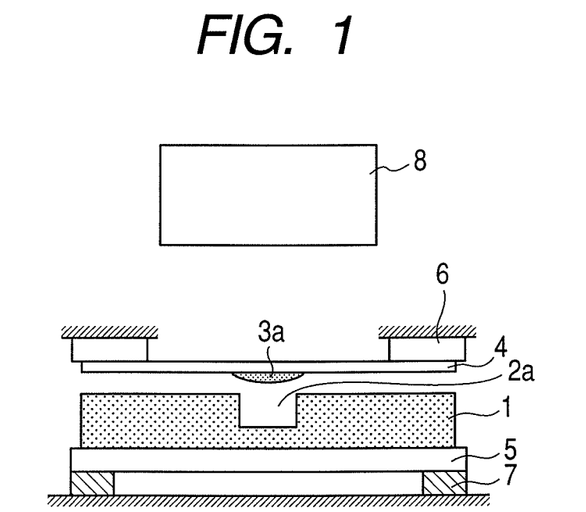
FIG. 1 is a schematic diagram, described in a first embodiment, illustrating the configuration of an apparatus for a microfluidic device for adhering UV curable resin to the upper portion of a fine depressed portion in a substrate and curing the UV resin.

FIG. 1 is a schematic diagram of the configuration of an apparatus describing the first embodiment of the present invention. In FIG. 1, a substrate 1 is formed of plastic or glass and provided with a fine depressed portion 2a such as a groove being a channel and a hole being a chamber. The apparatus also includes an ultraviolet (UV) curable resin 3 (the ultraviolet curable resin still to be cured is represented by 3a, and hereinafter the cured UV curable resin is represented by 3b).

The UV curable resin 3a is adhered on the face of the quartz substrate 4 opposing the substrate 1. The face of the quartz substrate 4 opposing the substrate 1 is preferably subjected in advance to a surface treatment. More specifically, a release agent such as a silane coupling agent is preferably applied thereto. Since quartz is high in transmittance of ultraviolet rays, quartz is used in the substrate 4. When an ultraviolet transmissive substrate using, for example, fluorite high in transmittance of ultraviolet rays is used, a material is optional. Also in the following embodiments, unless otherwise described, the quartz substrate 4 is preferably an ultraviolet transmissive substrate, more preferably a release agent is applied thereto. A substrate holding unit 5 holds the substrate 1. A quartz substrate holding unit 6 holds the quartz substrate 4. A stage 7 determines a relative positioning between the substrate 1 and the quartz substrate 4. Noncontact measurement such as an optical measurement or a mechanical abutting measurement may be applied to measurement for positioning according to required accuracy. In FIG. 1, although the stage 7 is provided on the side of the substrate 1, it may be mounted on the side of the quartz substrate 4. In that case, the quartz substrate 4 underlies the stage 7. The UV curable resin 3a can be maintained while being mounted on the quartz substrate, so that the shape of the UV curable resin adhered to the quartz substrate can be held. A UV irradiation unit 8 on the stage cures the UV curable resin 3a.

A method of covering the fine depressed portion 2a is described below with reference to FIGS. 2A, 2B and 2C.

Figure 2A:
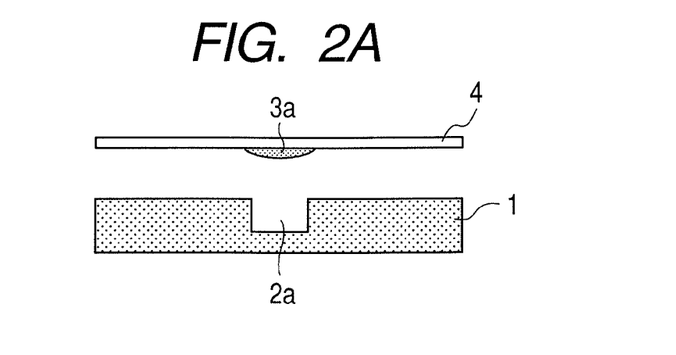
FIGS. 2A, 2B and 2C are schematic diagrams, described in the first embodiment, describing the steps of adhering UV curable resin to the upper portion of the fine depressed portion in the substrate and curing the UV resin.

FIG. 2A illustrates the substrate 1 and the quartz substrate 4 opposing the substrate 1. The UV curable resin 3a is adjusted in position by the stage 7 illustrated in FIG. 1 to cover the fine depressed portion 2a. The substrate 1 is brought into contact with the quartz substrate 4, as illustrated in FIG. 2B. The UV curable resin 3a is irradiated with the UV irradiation unit 8 from the other side of the quartz substrate 4 to cure the UV curable resin 3. Thereafter, detaching the substrate 1 from the quartz substrate 4 by the stage 7 provides the microfluidic device 1000 illustrated in FIG. 2C. The UV curable resin 3b is cured and the fine structure 2b in which the fine depressed portion 2a is sealed is obtained. If the fine depressed portion 2a is a groove, for example, the fine structure 2b serves as a channel. If the fine depressed portion 2a is a hole, the fine structure 2b serves as a chamber or a reservoir.

Although the above description uses the stage 7 for positioning between the substrate 1 and the quartz substrate 4 because the apparatus described with reference to FIG. 1 is used, the present invention is not limited to the above positioning method. For example, the substrate 1 may be manually brought into contact with the quartz substrate 4 so that the UV curable resin 3a cover the fine depressed portion 2a. That is common to the following embodiments.

Figure 3:
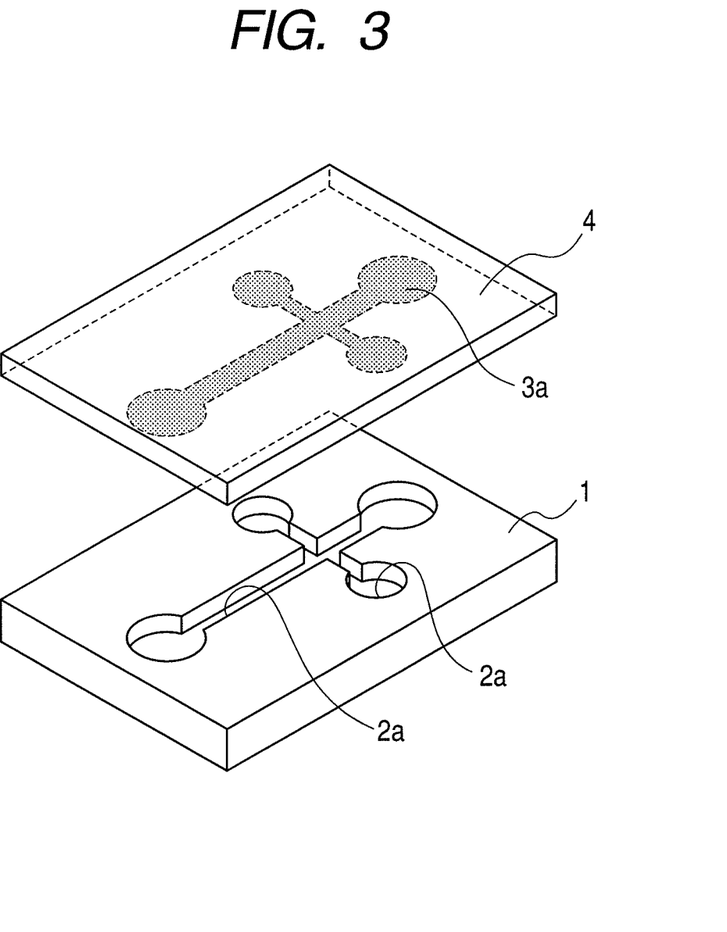
FIG. 3 is a schematic diagram, described in the first embodiment, describing the method of adhering UV curable resin to the upper portion of the fine depressed portion in the substrate.

FIG. 3 is a schematic diagram illustrating the UV curable resin 3a adhered only to a portion of the quartz substrate 4 opposing the fine depressed portion 2a in the substrate 1. More specifically, there is provided a step of forming the energy ray curable resin on the substrate so that the energy ray curable resin is formed into a pattern shape corresponding to the pattern shape of the fine depressed portion 2a.

Figure 4A:
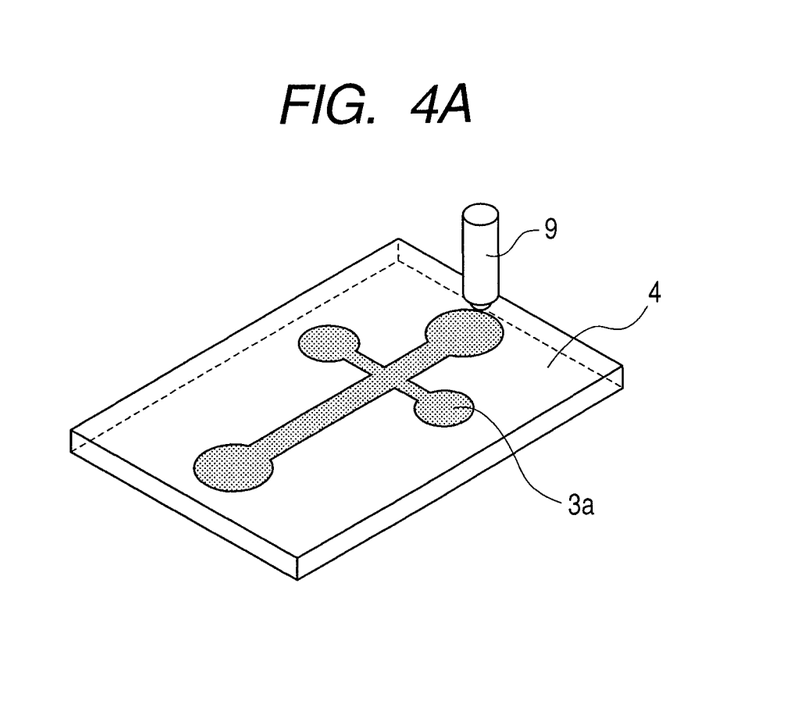
FIGS. 4A and 4B are schematic diagrams, described in the first embodiment, describing a quartz substrate for adhering the UV curable resin to the upper portion of the fine depressed portion in the substrate and a method of adhering the UV curable resin to the quartz substrate.
Figure 4B:
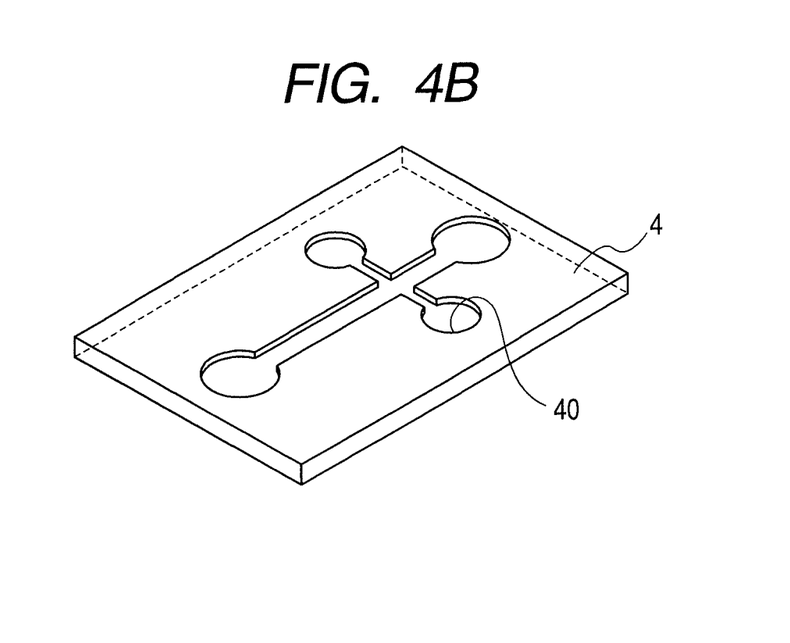

To do that, the UV curable resin 3a is adhered to the quartz substrate 4 with a dispenser 9 as illustrated in FIG. 4A. In addition, a groove being a UV curable resin holding unit 40 is preferably made in the quartz substrate 4 to easily hold the UV curable resin 3a on the quartz substrate 4 as illustrated in FIG. 4B. The quartz substrate 4 illustrated in FIGS. 4A and 4B shows the other side thereof in FIG. 3.

If the joint is accurately performed, the pattern shape to which the UV curable resin is adhered may be substantially the same as that of the fine depressed portion. Alternatively, the pattern shape to which the UV curable resin is adhered may be greater than that of the fine depressed portion to simplify the joint.

Figure 2B:
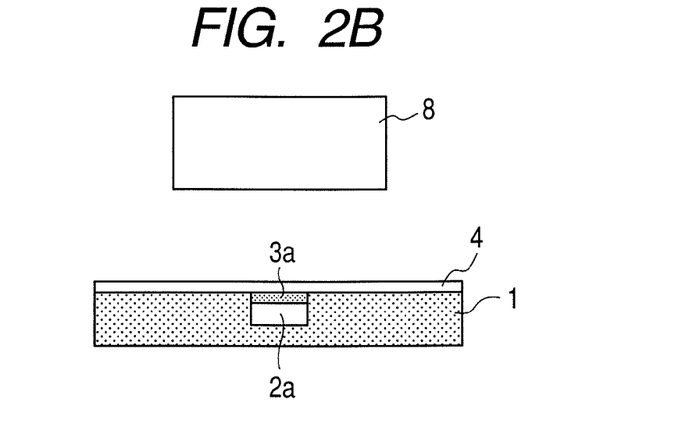
Figure 2C:
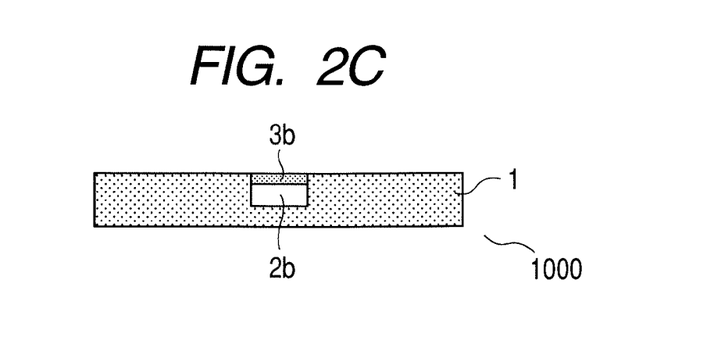

The fine depressed portion 2a of the substrate 1 in FIGS. 1 to 3 and the UV curable resin holding unit 40 in FIG. 4B subjected to fine pattern transfer by photolithography and then an anisotropic etching are illustrated by vertical sections. However, those are merely schematically illustrated for convenience and not limited. For example, an isotropic etching may also be used. In particular, the substrate 1 is not limited to glass. Plastics such as polycarbonate may be used. Plastics can be applied by injection molding and subjected to embossing. For the quartz substrate 4, the same holds true if other ultraviolet curable materials are used therefor. The method of producing the substrate 1 is the same as in the following embodiments.

Thus, according to the first embodiment, the UV curable resin 3a is adhered to the upper portion of the fine depressed portion 2a provided in the substrate 1 by the surface tension of the UV curable resin 3a and cured. The UV curable resin 3b cured by UV rays serves as a cover for the fine depressed portion 2a on the substrate 1 to enable suppressing the occurrence of non-joint portion and not to deform the composing elements of the microfluidic device 1000 (to enable suppressing the occurrence of stress). This suppresses the dispersion of a geometric individual difference of the microfluidic device 1000 to improve the controllability and productivity (yield) of the microfluidic device 1000. Great force produced by pressure joint or thermal deposition, for example, is not applied to the periphery of the fine depressed portion 2a in the process of the UV curable resin 3b serving as the cover. For this reason, even if a fine structure such as a nano-pillar is provided on the substrate 1, for example, it is enabled to suppress the breakdown of the fine structure.

Second Embodiment

In the first embodiment, a method is described in which the UV curable resin 3a is adhered only to a portion of the quartz substrate 4 opposing the fine depressed portion 2a of the substrate 1, thereby to cause the UV curable resin 3b cured by UV rays to serve as the cover for the fine depressed portion 2a on the substrate 1. In the second embodiment, a method is described in which the UV curable resin 3a is adhered to substantially the entire face of the quartz substrate 4 opposing the substrate 1 and the UV curable resin is caused to serve as the cover for the fine depressed portion 2a on the substrate 1.

Figure 5A:
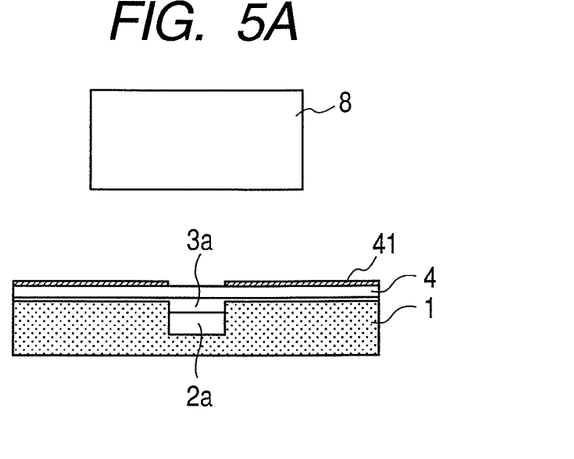
FIGS. 5A and 5B are schematic diagrams, described in a second embodiment, describing a method of adhering the UV curable resin to the upper portion of the fine depressed portion in the substrate.
Figure 5B:
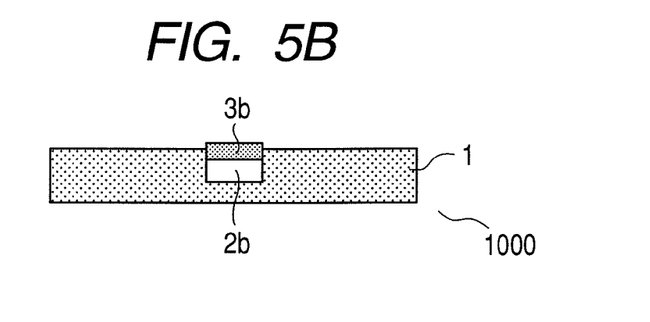

FIGS. 5A and 5B are schematic diagrams describing the second embodiment of the present invention. A shielding film 41 shields ultraviolet rays in FIG. 5A. The film is formed by evaporating metal such as chromium with the portion of the fine depressed portion 2a masked so that the portion can be irradiated with UV rays in view from the UV irradiation unit 8 when the fine depressed portion 2a of the substrate 1 is caused to oppose the quartz substrate 4. The other reference numerals have been described in the first embodiment, so that description thereof is omitted. In the following embodiments also, a duplicated description thereof is omitted.

As illustrated in FIG. 5A, the UV curable resin 3a is adhered to the entire face of the quartz substrate 4 opposing the substrate 1. There may be optionally available a coating method such as spin coating or spraying to adhere the UV curable resin 3a to the face. Positioning is performed on a stage (not shown, but refer to FIG. 1) so that the quartz substrate 4 on which the UV curable resin 3a is coated is caused to oppose the face of the fine depressed portion 2a of the substrate 1. Ultraviolet rays applied by the UV irradiation unit 8 cure only the UV curable resin 3a in the area where no shielding film 41 is formed. Thereafter, the quartz substrate 4 is detached from the substrate 1 on the stage (not shown). The removal of the UV curable resin 3a which has been shielded by the shielding film 41 and not cured turns the UV curable resin 3b into a cover of the fine depressed portion 2a on the substrate 1 as illustrated in FIG. 5B.

In the second embodiment, although the shielding film 41 is provided so that the UV curable resin 3a covers the fine depressed portion 2a of the substrate 1, the shielding film 41 is not required if there is no problem even if the UV curable resin 3b is left on substantially the entire face of the substrate 1 opposing the quartz substrate 4.

According to the second embodiment, the UV curable resin 3a can be adhered to the quartz substrate 4 simply and further can improve the productivity of the microfluidic device 1000.

Third Embodiment

In the first and the second embodiment, a method is described in which the UV curable resin 3a is adhered to the quartz substrate 4 in advance and oppose the substrate 1 and then cured by UV rays, thereby to cause the UV curable resin 3b to serve as the cover for the fine depressed portion 2a on the substrate 1. In the third embodiment, a method is described in which the quartz substrate 4 is caused to oppose the substrate 1 and the UV curable resin 3a is sent and cured by UV rays, thereby to cause the UV curable resin 3b to serve as the cover for the fine depressed portion 2a on the substrate 1.

Figure 6:
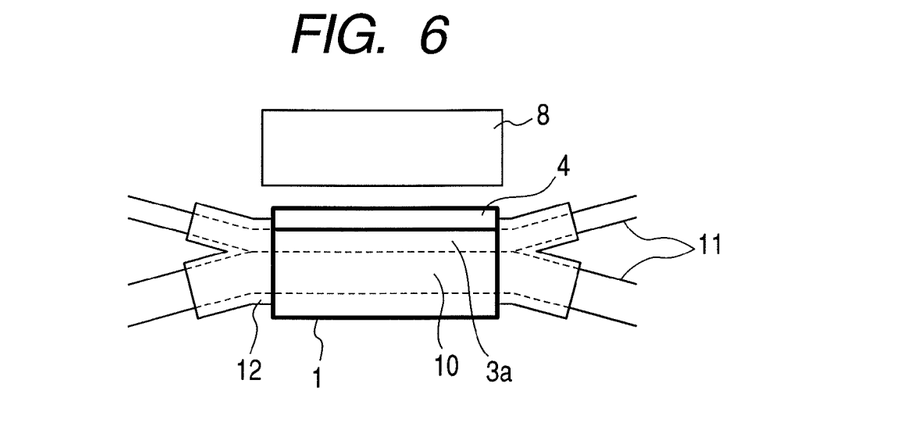
FIG. 6 is a schematic diagram, described in a third embodiment, describing a method of forming multplayer flows (two-layer flows) in the fine depressed portion on the substrate to cure the UV curable resin in one of the multiplayer flows.

FIG. 6 is a schematic cross section describing the third embodiment of the present invention. In FIG. 6, water 10 is caused to flow to the fine depressed portion 2a on the substrate 1 while forming a layer and an interface between the water 10 and the UV curable resin 3a. For this reason, there are provided a pipe 11 for sending the UV curable resin 3a and the water 10 and connectors 12 for attaching the pipe 11 to the substrate 1. The substrate 1 is caused to oppose the quartz substrate 4 and the connectors 12 are attached thereto. A liquid sending unit (not shown) sends the UV curable resin 3a and the water 10 to the pipe. Each flows into the substrate 1 illustrated in FIG. 6 while forming a layer and an interface. Thereafter, the liquid is stopped to be sent by the liquid sending unit (not shown) or a valve, the UV curable resin 3a is irradiated with UV rays by the UV irradiation unit 8 and cured and the substrate 1 is detached from the quartz substrate 4 by the stage 7 not shown in FIG. 6 (refer to FIG. 1). Thereby, the UV curable resin 3b can be caused to serve as the cover for the fine depressed portion 2a to provide the fine structure 2b. It is needless to say that the UV curable resin 3a left in the pipe 11 and the connectors 12 should be rinsed and the connectors 12 attached to the substrate 1 should be removed.

The water 10 has its object to form a layer and an interface between the water and the UV curable resin 3a and not to be cured even if it is irradiated with UV rays, so that liquid is not limited to water 10 and may be UV incurable liquid. However, it is preferable not to disturb the layer and the interface as much as possible, and it is desirable not to use liquid easily soluble to the UV curable resin 3a.

According to the third embodiment, the UV curable resin 3a and the water 10 can form a stable layer and interface, so that the inner wall of the UV curable resin 3b of the obtained fine structure 2b is smoothened even if the fine depressed portion 2a on the substrate 1 is long or wider in area. In other words, a uniform sectional shape can be obtained, so that controllability such as liquid sending in the microfluidic device 1000 can be improved.

Fourth Embodiment

In the first to the third embodiment, a method is described in which the substrate 1 is caused to oppose the quartz substrate 4, the UV curable resin 3a therebetween is cured and the cured the UV curable resin 3b is caused to serve as the cover for the fine depressed portion 2a on the substrate 1. In the fourth embodiment, a method is described in which the quartz substrate 4 is caused to oppose the substrate 1 and the UV curable resin 3a adhered to the quartz substrate 4 is transferred to the upper portion of the fine depressed portion 2a on the substrate 1 and cured, thereby to cause the UV curable resin 3b to serve as the cover for the fine depressed portion 2a on the substrate 1.

Figure 7A:
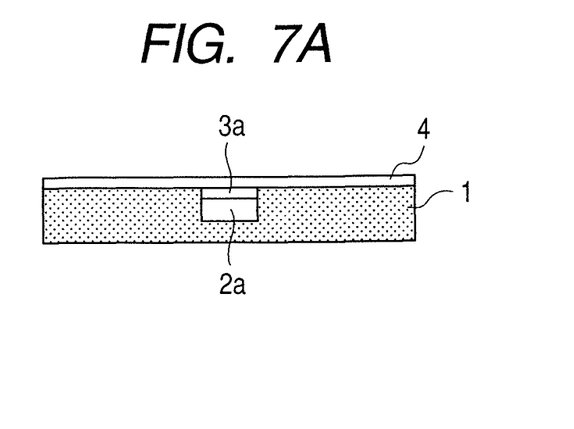
FIGS. 7A, 7B and 7C are schematic diagrams, described in a fourth embodiment, describing a method of adhering the UV curable resin to the upper portion of the fine depressed portion in the substrate.
Figure 7B:
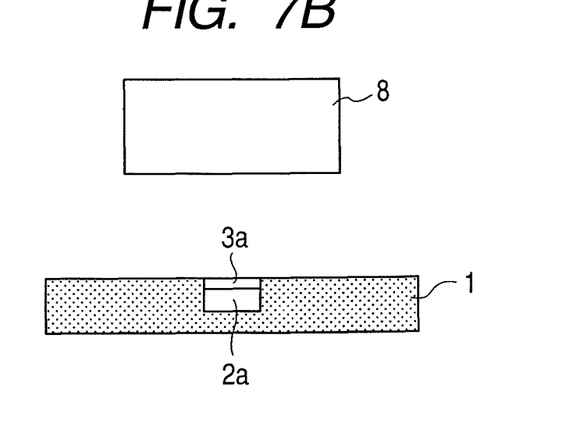
Figure 7C:
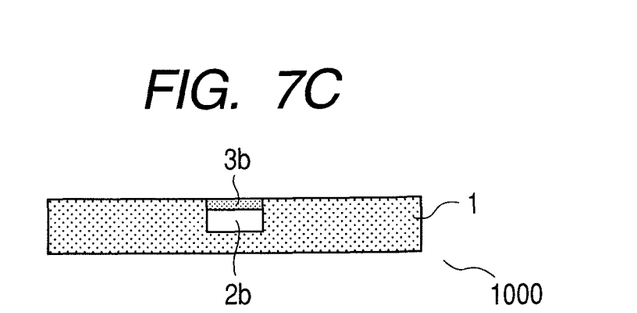

FIG. 7A is a schematic diagram illustrating the state where the quartz substrate 4 to which the UV curable resin 3a is adhered in advance is caused to oppose the substrate 1. In this state, the substrate 1 is detached from the quartz substrate 4 by a stage not shown (refer to FIG. 1). As illustrated in FIG. 7B, the UV curable resin 3a transferred to the upper portion of the fine depressed portion 2a on the substrate 1 is irradiated with UV rays by the UV irradiation unit 8, thereby to cause the cured UV curable resin 3b to serve as the cover for the fine depressed portion 2a on the substrate 1 as illustrated in FIG. 7C. In the first to the third embodiment, the UV curable resin 3a is irradiated with UV rays through the quartz substrate 4 to cure the UV curable resin 3a, so that the quartz substrate 4 or the ultraviolet transmissive substrate is used, however, in the fourth embodiment, the UV curable resin 3a is directly irradiated with UV rays, so that the material of the substrate to which the UV curable resin 3a transferred may be a material which does not transmit ultraviolet rays.

In the first to the third embodiment, a release agent can be applied to the quartz substrate 4 and still can be applied thereto periodically. According to the fourth embodiment, the release agent is not required, which eliminates the need for a periodic maintenance.

Fifth Embodiment

In the fourth embodiment, a method is described in which the UV curable resin 3a adhered to the quartz substrate 4 is transferred to the upper portion of the fine depressed portion 2a of the substrate 1. In the fifth embodiment, a method is described in which the UV curable resin 3a is adhered directly to the upper portion of the fine depressed portion 2a of the substrate 1.

Figure 8A:
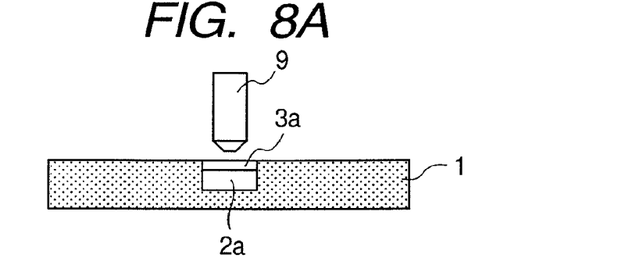
FIGS. 8A, 8B and 8C are schematic diagrams, described in a fifth embodiment, describing a method of adhering the UV curable resin to the upper portion of the fine depressed portion in the substrate.
Figure 8B:
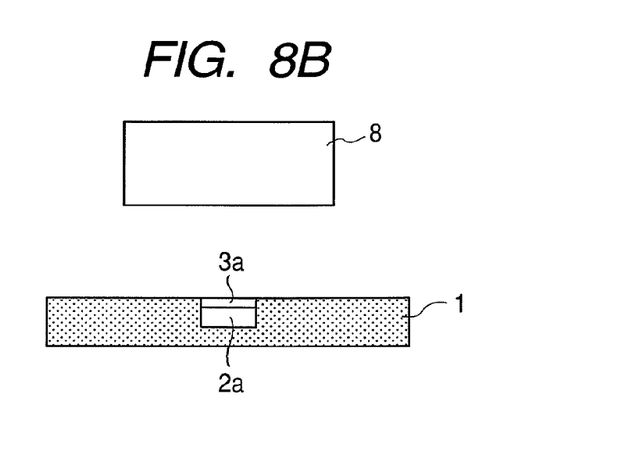
Figure 8C:
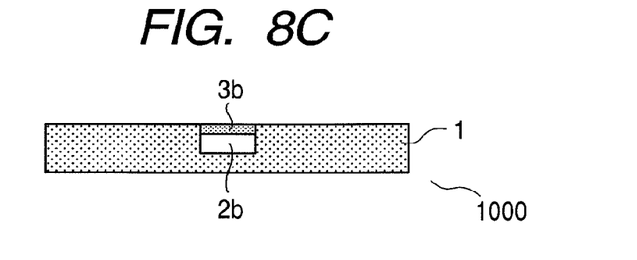

FIG. 8A is a schematic diagram illustrating the state where the UV curable resin 3a is adhered directly to the upper portion of the fine depressed portion 2a of the substrate 1 using the dispenser 9. As illustrated in FIG. 8B, the UV curable resin 3a transferred to the upper portion of the fine depressed portion 2a of the substrate 1 is irradiated with UV rays by the UV irradiation unit 8 to turn the cured UV curable resin 3b into the cover for the fine depressed portion 2a on the substrate 1 as illustrated in FIG. 8C.

According to the fifth embodiment, the quartz substrate 4 is not required and the UV curable resin 3a can be adhered directly to the upper portion of the fine depressed portion 2a of the substrate 1. It is enabled to adapt manufacturing of a wide variety of the microfluidic devices 1000.

In the first to the fifth embodiment, a method is described in which the UV curable resin 3a is cured and the cured UV curable resin 3b is caused to serve as the cover for the fine depressed portion 2a on the substrate 1. However, what serves as the cover is not limited to the UV curable resin 3. For example, thermoset polymer may be used. In other words, a material that is cured by the irradiation of energy rays is effective. In that case, the quartz substrate (ultraviolet transmissive substrate) used in the first to the third embodiment may be a substrate which does not transmit ultraviolet rays. However, a release agent is preferably applied to the substrate.

The present invention is not limited to the above embodiments and various changes and modifications can be made within the spirit and scope of the present invention. Therefore to apprise the public of the scope of the present invention, the following claims are made.

This application claims the benefit of Japanese Patent Application No. 2007-239244, filed Sep. 14, 2007, which is hereby incorporated by reference in its entirety.

The invention claimed is:

1. A method of producing a microfluidic device including a substrate in which a depressed portion is formed and a cover member for covering the upper face of the depressed portion, the method comprising the steps of:
adhering an energy ray curable resin still to be cured to the surface of the substrate in which the depressed portion is formed so as to cover the upper face of the depressed portion of the substrate; and
irradiating with an energy ray the adhered energy ray curable resin still to be cured,
wherein the adhesion step includes the steps of:
adhering the energy ray curable resin still to be cured to a supporting unit for supporting the energy ray curable resin; and
causing the surface of the supporting unit to which the energy ray curable resin is adhered to oppose the surface of the substrate in which the depressed portion is formed.

2. The method of producing the microfluidic device according to claim 1, wherein the adhesion step comprises the step of forming a pattern shape of the energy ray curable resin on the supporting unit according to a pattern shape of the depressed portion of the substrate.

3. The method of producing the microfluidic device according to claim 1, wherein the depressed portion is to be one part of the wall surface of a channel and wherein the energy ray curable resin still to be cured is adhered to the surface of the substrate in which the depressed portion is formed so as to cover the upper face of the depressed portion of the substrate to be the wall surface of the channel and so as to not cover the substrate other than the depressed portion.

4. The method of producing the microfluidic device according to claim 3, wherein the energy ray curable resin includes an ultraviolet curable resin and/or a thermoset resin.

5. The method of producing the microfluidic device according to claim 3, wherein an ultraviolet light source and an ultraviolet optical system, and/or a heat generating unit are used in the irradiating step.

6. A method of producing a microfluidic device including a substrate in which a depressed portion is formed and a cover member for covering the upper face of the depressed portion, the method comprising the steps of:
adhering an energy ray curable resin still to be cured to the surface of the substrate in which the depressed portion is formed so as to cover the upper face of the depressed portion of the substrate; and
irradiating with an energy ray the adhered energy ray curable resin still to be cured,
wherein the adhesion step includes the steps of:
closing the upper face of the depressed portion of the substrate by a closing unit;
causing the energy ray curable resin still to be cured and a non energy ray curable liquid to flow into the depressed portion of the substrate to form a layer and an interface; and
stopping the flow after the layer and the interface have been formed.

* * * * *